United States Patent [19]
Ludlam et al.

[11] Patent Number: 5,459,857
[45] Date of Patent: Oct. 17, 1995

[54] FAULT TOLERANT DISK ARRAY DATA STORAGE SUBSYSTEM

[75] Inventors: Henry S. Ludlam, Longmont; Charles A. Milligan, Golden; George A. Rudeseal, Boulder; Paul R. Swiatek, Lafayette, all of Colo.

[73] Assignee: Storage Technology Corporation, Louisville, Colo.

[21] Appl. No.: 312,668

[22] Filed: Sep. 27, 1994

Related U.S. Application Data

[63] Continuation of Ser. No. 883,787, May 15, 1992, abandoned.

[51] Int. Cl.[6] ................................................ G06F 11/00
[52] U.S. Cl. ............................. 395/182.04; 364/268.5
[58] Field of Search ............................. 371/10.1, 11.1; 395/575; 364/268.5, 245

[56] References Cited

U.S. PATENT DOCUMENTS

| | | | |
|---|---|---|---|
| 4,342,079 | 7/1982 | Stewart et al. | 364/200 |
| 4,849,978 | 7/1989 | Dishon et al. | 371/51 |
| 4,862,411 | 8/1989 | Dishon et al. | 364/952 |
| 5,051,887 | 9/1991 | Berger et al. | 364/200 |
| 5,123,099 | 6/1992 | Shibata et al. | 395/425 |
| 5,155,835 | 10/1992 | Belsan | 395/425 |
| 5,155,845 | 10/1992 | Beal et al. | 395/575 |
| 5,159,671 | 10/1992 | Iwami | 395/575 |
| 5,170,471 | 12/1992 | Bonevento et al. | 395/275 |
| 5,175,839 | 12/1992 | Ikeda et al. | 395/425 |
| 5,185,864 | 2/1993 | Bonevento et al. | 395/275 |
| 5,247,618 | 9/1993 | Davis et al. | 395/275 |
| 5,274,645 | 12/1993 | Idlemann et al. | 371/10.1 |

FOREIGN PATENT DOCUMENTS

| | | | |
|---|---|---|---|
| 0323123A2 | 12/1988 | European Pat. Off. | G06F 11/00 |
| 3142504A1 | 11/1980 | Germany | G06F 3/06 |
| 57-111900 | 7/1982 | Japan | G11C 29/00 |
| 1-19438 | 1/1989 | Japan | G06F 11/20 |
| 1-120650 | 5/1989 | Japan | G06F 12/08 |
| 2-32419 | 2/1990 | Japan | G06F 3/06 |
| 2-91717 | 3/1990 | Japan | G06F 3/06 |
| 2-93721 | 4/1990 | Japan | G06F 3/06 |
| 2086625 | 10/1981 | United Kingdom | G06F 3/00 |
| WO94/00816 | 1/1994 | WIPO | G06F 13/00 |

OTHER PUBLICATIONS

EMC Corporation v. Storage Technology Corporation, In the United States District Court for the District of Delaware, Civil Action No. 94–482 JJF, Plaintiff EMC Corporation's Responses to Defendant's Second Set of Interrogatories Nos. 10–17.

Storage Technology Corporation, Confidential Document, Dec., 1987, STK Doc. 1012202.

Storage Technology Corporation, Internal Document, EV 050, STK v. EMC, STK 12435.

*Primary Examiner*—Robert W. Beausoliel, Jr.
*Assistant Examiner*—Joseph E. Palys
*Attorney, Agent, or Firm*—Duft, Graziano & Forest

[57] ABSTRACT

A pair of operationally independent disk drive array data storage subsystems are used to emulate one or more physical devices shared between two control modules. The storage control units of the two data storage subsystems are interconnected by at least one data link to exchange control and data signals therebetween. The storage control units of both data storage subsystems are synchronized to maintain identical virtual device images of certain assigned virtual devices both of the data storage subsystems wherein the duplicated data records of the single virtual device are stored. The data records are therefore stored in available memory on both of the two data storage subsystems. Data is exchanged over the data link to maintain consistency of the two sets of mapping tables.

54 Claims, 8 Drawing Sheets

FAULT TOLERANT DISK ARRAY DATA STORAGE SUBSYSTEM

This application is a continuation of application Ser. No. 07/883,787, filed May 15, 1992, now abandoned.

FIELD OF THE INVENTION

This invention relates to disk memory systems and, in particular, to a fault tolerant disk drive array data storage subsystem.

PROBLEM

It is a problem in the field of data storage subsystems to provide fault tolerant operation in order to avoid the loss of critical data stored therein. There are numerous prior art fault tolerant DASD configurations used to address the primary failure modes of disk drives, although these tend to be expensive and still have secondary fault tolerance problems. Of particular interest is the dual copy feature found in IBM's 3990 Storage Control System which provides a fault tolerant capability for the data stored therein by maintaining two identical copies of the data in the single data storage subsystem. This is accomplished by reproducing each data record stored on one of the disk drives managed by the storage control unit onto a second disk drive managed by the same storage control unit. This arrangement significantly increases the cost of data storage since two identical copies of all the data records are maintained at all times in the one data storage subsystem. In addition, the failure of the single storage control unit causes the loss of all of the data records since both copies of the data records are managed by the single storage control unit.

The use of two independent data storage subsystems, each with their own storage control unit, to implement the dual copy feature is prohibitively expensive in terms of the use of host processor time, since the processor must transmit each data record twice, once to the primary data storage subsystem and again to the secondary data storage subsystem. The overhead in processor time is typically more of a detriment to the user than the possibility of losing data records due to the failure of a storage control unit. The storage control units themselves can not be interconnected in this configuration since they operate slavishly under the control of the host processor and can not initiate any data transfers or data management functions themselves.

Therefore, existing disk memory systems require that the host processor be aware of and actively manage the redundancy aspects contained in the disk memory system. These systems also require extensive duplicate hardware to provide any significant fault tolerance using redundancy. Therefore, there presently exists no inexpensive fault tolerant data storage subsystem configuration nor one that minimizes the possibility of a single failure in the storage control unit causing the loss of access to data stored on the disk drives within the data storage subsystem.

SOLUTION

The above described problems are solved and a technical advance achieved in the field by the fault tolerant disk drive array data storage subsystem of the present invention. This configuration consists of two interconnected, dynamically mapped disk drive array data storage subsystems which emulate the operation of two storage control units sharing a single extremely reliable physical disk drive. This apparatus operates independent of the host processor and mimics the operation of a single DASD device even though the data is stored on a plurality of devices located in two operationally independent but cooperatively operative data storage subsystems.

Each data storage subsystem consists of a plurality of small form factor disk drives which are configured into a plurality of redundancy groups, each of which includes n+m disk drives for storing data records and associated redundancy data thereon. The plurality of disk drives are dynamically configurable by the data storage subsystem into redundancy groups for the storage of data records thereon. Mapping tables are used to indicate the correspondence between the virtual device image presented to the associated host processor and the physical storage location on the plurality of disk drives in the redundancy group in which the associated data record is stored. The use of redundancy data stored with the data records provides a significant increase in the reliability of these virtual devices over conventional data storage volumes.

The storage control units of the two data storage subsystems are interconnected by at least one data link to exchange control and data signals therebetween. The storage control units of both data storage subsystems are synchronized to maintain data in the respective mapping tables that indicate the physical locations in the data storage subsystems wherein the data records of the single virtual device are stored. The data records are therefore stored in available memory on both of the data storage subsystems and both data storage subsystems maintain mapping tables to present to the host processor the image of a single physical data storage device shared by two control modules. Data is exchanged over the data link between the two data storage subsystems storage control units to maintain consistency of the two sets of mapping tables. In addition, data records that require duplication for reliability purposes are transmitted over the data link to enable the host processor to access the data records via either storage control unit. This interconnection of the two data storage subsystems enables the host processor to access the data records even if one or more critical elements fail in the data storage subsystems or data channels that interconnect the host processor to the storage control units. The failure of a critical element is transparent to the host processor, since the data can be accessed via another data access path without requiring the system operator to perform any manual intervention activities.

DETAILED DESCRIPTION

Figure 1:
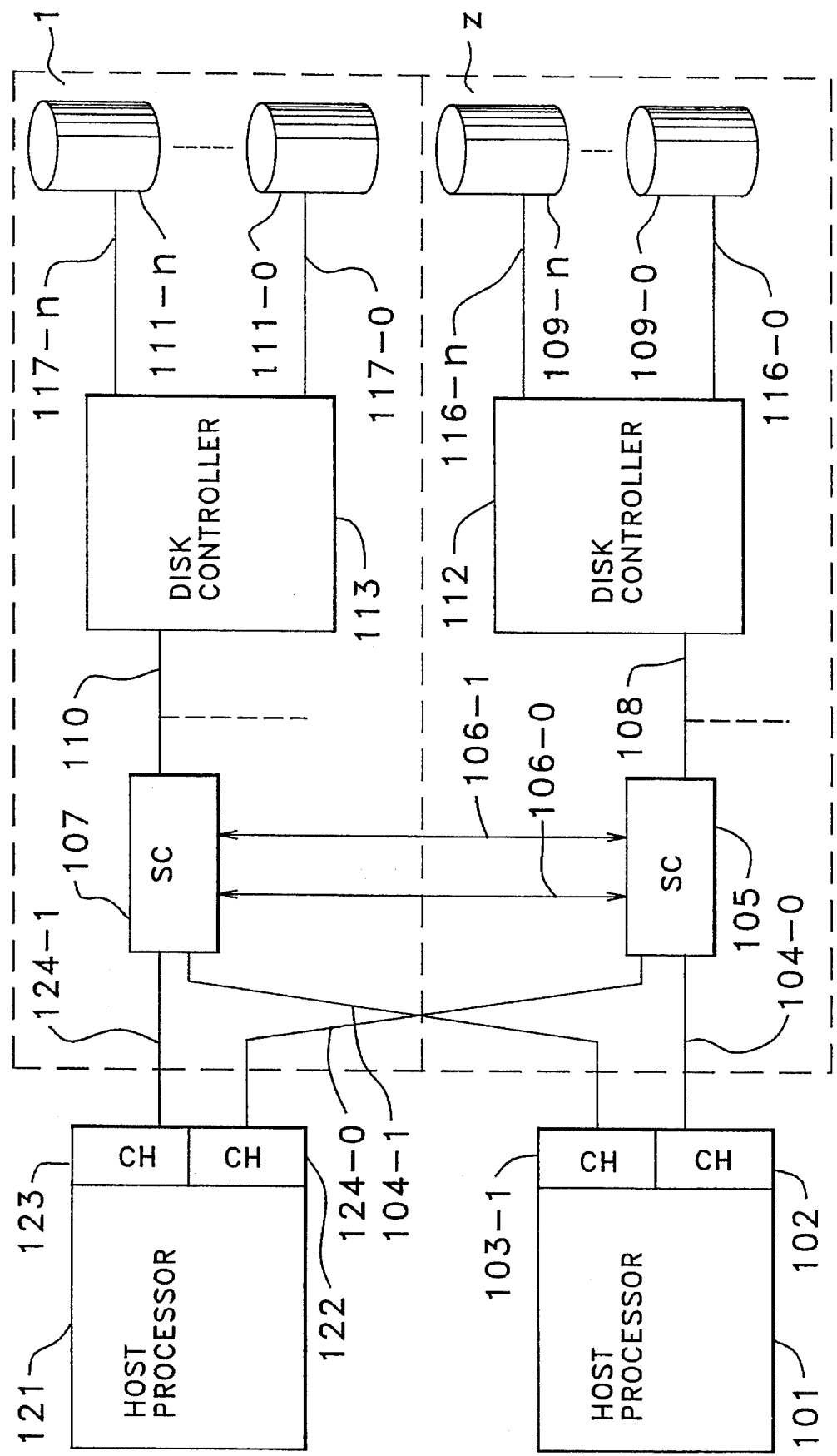
FIG. 1 illustrates the architecture of the fault tolerant disk drive array data storage subsystem in block diagram form.

The data storage subsystem of the present invention uses a plurality of small form factor disk drives in place of a single large form factor disk drive to implement an inexpensive, high performance, high reliability disk drive memory that emulates the format and capability of large form factor disk drives. The plurality of disk drives in the disk drive array data storage subsystem are configured into a plurality of variable size redundancy groups of N+M parallel connected disk drives to store data thereon. Each redundancy group, also called a logical disk drive, is divided into a number of logical cylinders, each containing i logical tracks, one logical track for each of the i physical tracks contained in a cylinder of one physical disk drive. Each logical track is comprised of N+M physical tracks, one physical track from each disk drive in the redundancy group. The N+M disk drives are used to store N data segments, one on each of N physical tracks per logical track and to store M redundancy segments, one on each of M physical tracks per logical track in the redundancy group. The N+M disk drives in a redundancy group have unsynchronized spindles and loosely coupled actuators. The data is transferred to the disk drives via independent reads and writes since all disk drives operate independently. Furthermore, the M redundancy segments, for successive logical cylinders, are distributed across all the disk drives in the redundancy group rather than using dedicated redundancy disk drives. The redundancy data is distributed so that every actuator in a redundancy group is used to access data stored on the disk drives.

Each physical disk drive is designed so that it can detect a failure in its operation, which allows the M redundancy segments per logical track to be used for multi-bit error correction. Identification of the failed physical disk drive provides information on the bit position of the errors in the logical track and the redundancy data provides information to correct the errors. Once a failed disk drive in a redundancy group is identified, a backup disk drive from the shared pool of backup disk drives is automatically switched in place of the failed disk drive. Control circuitry reconstructs the data stored on each physical track of the failed disk drive, using the remaining N-1 physical tracks of data plus the associated M physical tracks containing redundancy segments of each logical track.

The disk drive array data storage subsystem includes a data storage management system that provides improved data storage and retrieval performance by dynamically mapping between virtual and physical data storage devices. The disk drive array data storage subsystem consists of three abstract layers: virtual, logical and physical. The virtual layer functions as a conventional large form factor disk drive memory. The logical layer functions as an array of storage units that are grouped into a plurality of redundancy groups, each containing N+M physical disk drives. The physical layer functions as a plurality of individual small form factor disk drives. The data storage management system operates to effectuate the dynamic mapping of data among these abstract layers and to control the allocation and management of the actual space on the physical devices. These data storage management functions are performed in a manner that renders the operation of the disk drive array data storage subsystem transparent to the host processor which perceives only the virtual image of the disk drive array data storage subsystem.

The performance of this system is enhanced by the use of a cache memory with both volatile and nonvolatile portions and "backend" data staging and destaging processes. Data received from the host processors is stored in the cache memory in the form of new data or modifications to data already stored in the redundancy groups of the data storage subsystem. No data stored in a redundancy group is modified. A virtual track is staged from a redundancy group into cache. The host then modifies some, perhaps all, of the records on the virtual track. Then, as determined by cache replacement algorithms such as Least Recently Used, etc, the modified virtual track is selected to be destaged to a redundancy group. When thus selected, a virtual track is divided (marked off) into several physical sectors to be stored on one or more physical tracks of one or more logical tracks. A complete physical track may contain physical sectors from one or more virtual tracks. Each physical track is combined with N-1 other physical tracks to form the N data segments of a logical track.

The original, unmodified data is then flagged as obsolete. Obviously, as data is modified, the redundancy groups contain numerous virtual tracks of obsolete data. The valid virtual tracks in a logical cylinder are read to the cache memory in a background "free space collection" process. They are then written to a previously emptied logical cylinder and the "collected" logical cylinder is tagged as being empty. Thus, all redundancy data creation, writing and free space collection occurs in background, rather than on-demand processes. This arrangement avoids the parity update problem of existing disk array systems and improves the response time versus access rate performance of the data storage subsystem by transferring these overhead tasks to background processes.

Fault Tolerant Architecture

FIG. 1 discloses a fault tolerant configuration of two data storage subsystems 1, 2. Host processors 101, 121 are connected via channels 102,103 and 122, 123 to data storage subsystems 1, 2 which include storage control units 105, 107, each of which is connected to a disk controller 112, 113 and its disk drives 109-0 through 109-n, 111-0 through 111-n via paths 116-0 through 116-n, 117-0 through 117-n. Data links 106 interconnect storage control unit 105 of data storage subsystem 1 with storage control unit 107 of data storage subsystem 2. Data links 106 are typically an optical fiber transmission medium but may be any type of transmission path.

Host processors 101, 121 transmit data record write and read requests to storage control units 105 and 107 in a conventional manner. The one of storage control units 105 and 107 that receives these requests (for example 105) communicates with its associated disk controller 112 and disk drives 109 to execute the write and read requests. In addition, in response to a received data record write command, storage control unit 105 transmits the received data record over data link 106 to storage control unit 107 to maintain identical virtual device images in both storage control units 105 and 107 and identical data records in data storage subsystems 1, 2. The system of FIG. 1 provides increased data availability over that which would be available if data storage subsystem 2 with disk drives 111, disk controller 113, storage control unit 107 and data link 106 were not provided.

Increased data availability is provided in that an operational failure, for example, of the channel interface of storage control unit 105 makes all data records on disk drives 109 unavailable to host processor 101. This failure causes host processor 101 to access storage control unit 107 via channel interface 103 to retrieve the data records from data storage subsystem 2. Host processor 101 is unaware of the existence of two independent data storage subsystems 1, 2 and no intervention is required to enable this alternative access to the duplicate copy of the requested data record. The retrieved information is transmitted to host processor 101 from disk drives 111, via storage control unit 107 and channel 104-1.

Figure 8:
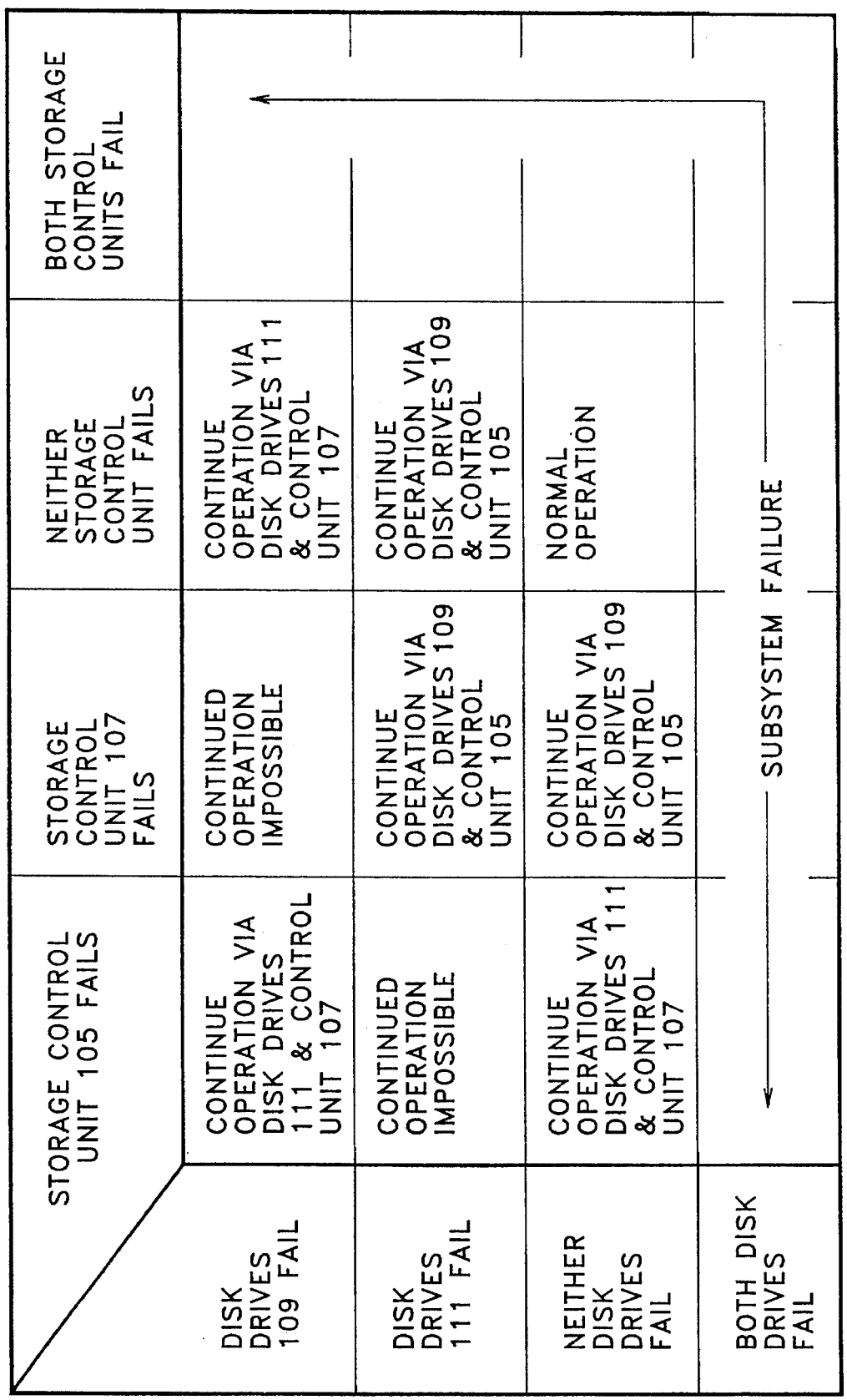
FIG. 8 illustrates a failure status table for this system.

The various failure and recovery modes are illustrated in FIG. 8 in table form. It is obvious from the architecture illustrated in FIG. 1 and this table that it requires the failure of certain combinations of at least two major components in these interconnected systems to result in a subsystem failure. If a storage control unit, for example, 105, fails or a set of disk drives 109 fails, the associated data storage subsystem 1 causes a "NOT OPERATIONAL" response to the host processor 101, which then selects another channel 103 to access the remaining storage control unit 107 to access the data stored on disk drives 111. Thus, it requires the loss of both redundancy groups that store the selected data record, or both storage control units or a storage control unit in one data storage subsystem and the selected redundancy group in the other data storage subsystem to suffer a subsystem failure. The host processor therefore automatically "recovers" from the failure by accessing the duplicate copy of the data record in response to the "NOT OPERATIONAL" status presented by the data storage subsystem in which a failure occurs.

Storage Control Unit Architecture

Figure 2:
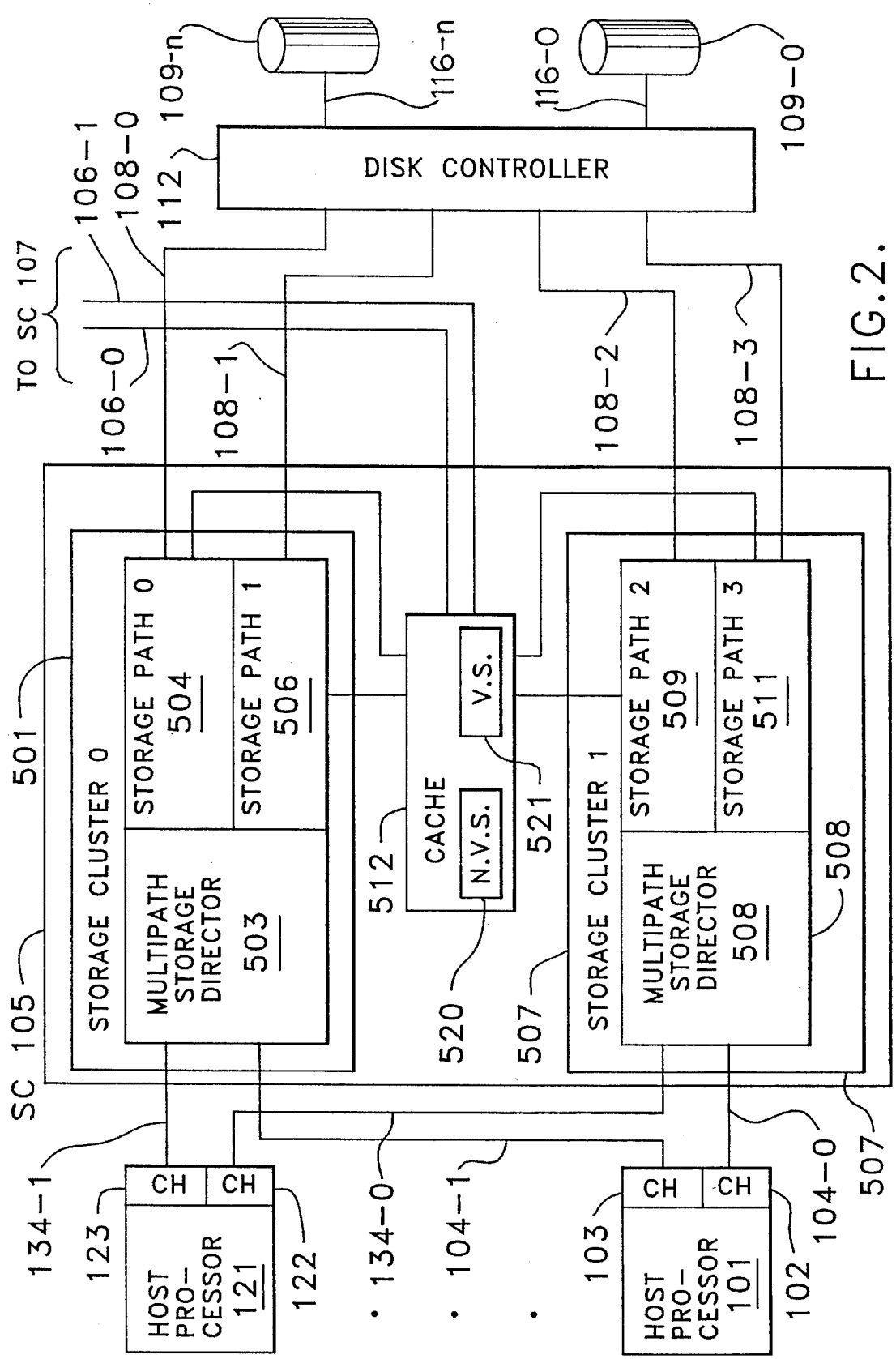
FIG. 2 illustrates the architecture of a single disk drive array system.
Figure 3:
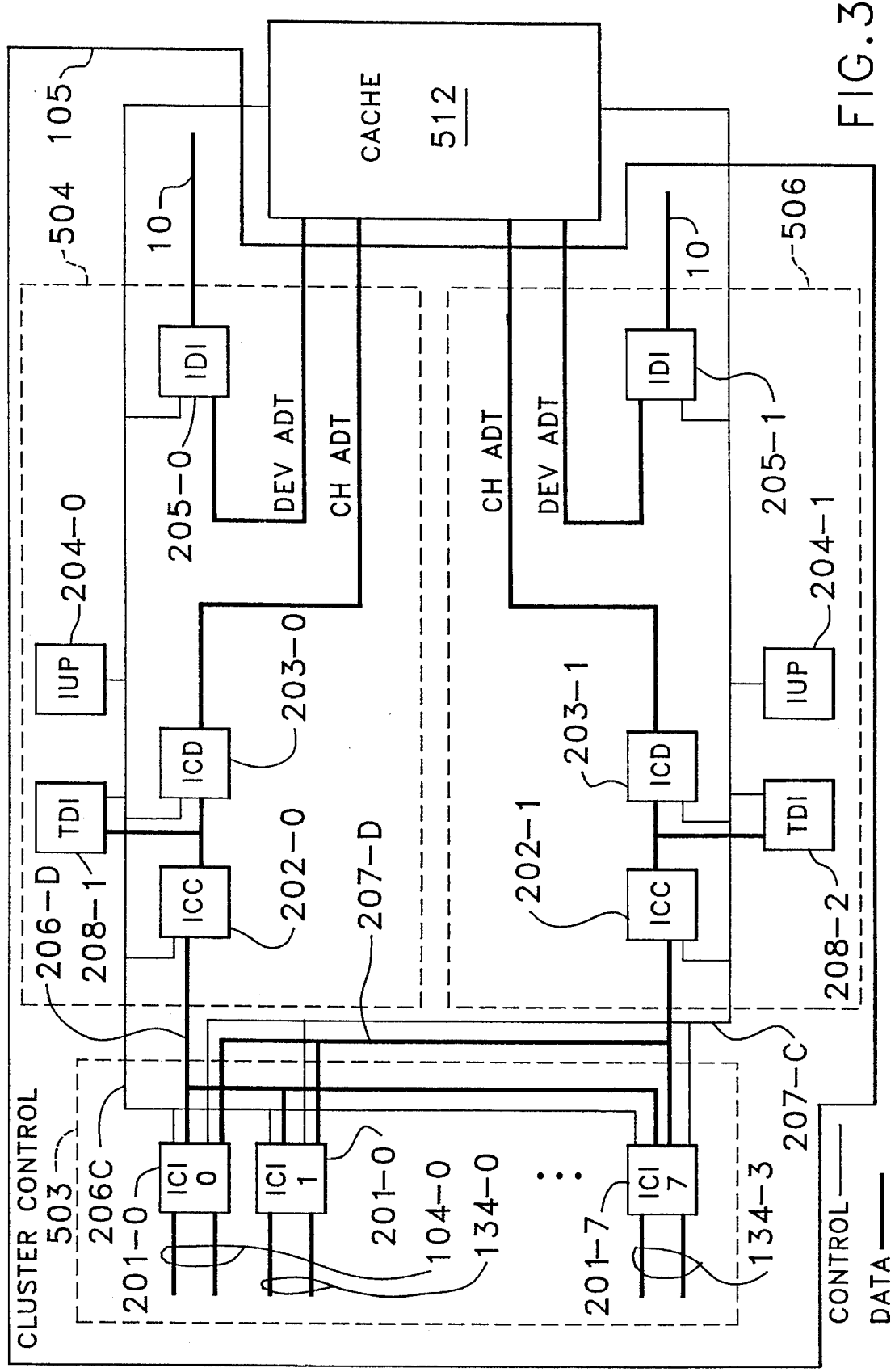
FIG. 3 illustrates further details of a storage control unit.

FIG. 2 illustrates in block diagram form the architecture of the preferred embodiment of the disk drive array data storage subsystems 1, 2. Each disk drive array data storage subsystem 1 appears to the associated host processors 101, 121 to be a collection of large form factor disk drives with their associated storage control, since the architecture of disk drive array data storage subsystem 1 is transparent to the associated host processors 101, 121. This disk drive array data storage subsystem 1 includes a plurality of disk drives (109-1 to 109-n) which are typically the commodity hard disk drives in the 5¼ inch form factor.

The architecture illustrated in FIGS. 1 and 2 is that of a plurality of host processors 101, 121 interconnected via the respective plurality of data channels 104, 134, respectively to a data storage subsystem 1, 2 that provides the backend data storage capacity for the host processors 101, 121. This basic configuration is well known in the data processing art. Each data storage subsystem 1 includes a storage control unit 105 that serves to interconnect the disk drives 109-1 to 109-n and their associated disk drive controller 112 with the data channels 104, 134 that interconnect data storage subsystem 1 with the plurality of host processors 101, 121.

Storage control unit 105 includes typically two cluster controls 501, 508 for redundancy purposes. Within a cluster control 501, the multipath storage director 503 provides a hardware interface to interconnect data channels 104, 134 to cluster control 501 contained in storage control unit 105. In this respect, the multipath storage director 503 provides a hardware interface to the associated data channels 104, 134 and provides a multiplex function to enable any attached data channel 104, 134 from any host processor 101, 121 to interconnect to a selected cluster control 501 within storage control unit 105. The cluster control 501 itself provides a pair of storage paths 504, 506 which function as an interface to a plurality of optical fiber backend channels 108. In addition, the cluster control 501 includes a data compression function as well as a data routing function that enables cluster control 501 to direct the transfer of data between a selected data channel 104-1 and cache memory 512, and between cache memory 512 and one of the connected optical fiber backend channels 108-1. The cache memory 512 includes a volatile store portion (VS) 521 and a non-volatile store portion (NVS) 520. Storage control unit 501 provides the major data storage subsystem control functions that include the creation and regulation of data redundancy groups, reconstruction of data for a failed disk drive, switching a spare disk drive in place of a failed disk drive, data redundancy generation, logical device space management, and virtual to logical device mapping. These subsystem functions are discussed in further detail below.

Disk controller 112 interconnects the plurality of commodity disk drives 109-1 to 109-n included in disk drive array with the plurality of optical fiber backend channels 108. Disk controller 112 includes input/output circuits (not shown) that provide a hardware interface to interconnect the optical fiber channels 108 with the data paths 116 that serve disk drives 109. The data that is written onto the disk drives 109 consists of data that is transmitted from an associated host processor 101 over data channel 104-1 to one of cluster controls 501, 507 in storage control unit 105. The data is written into, for example, cluster control 501 which stores the data in cache memory 512. Cluster control 501 stores N physical tracks of data in cache 512 and then generates M redundancy segments for error correction purposes. Cluster control 501 then selects a subset of disk drives 109 to form a redundancy group to store the received data. Cluster control 501 selects an empty logical track, consisting of N+M physical tracks, in the selected redundancy group. Each of the N physical tracks of the data are written onto one of N disk drives in the selected data redundancy group. An additional M disk drives are used in the redundancy group to store the M redundancy segments. The M redundancy segments include error correction characters and data that can be used to verify the integrity of the N physical tracks that are stored on the N disk drives as well as to reconstruct one or more of the N physical tracks of the data if that physical track were lost due to a failure of the disk drive on which that physical track is stored.

Thus, data storage subsystems 1, 2 can emulate one or more large form factor disk drives (ex—an IBM 3380 type of disk drive) using a plurality of smaller form factor disk drives while providing a high reliability capability by writing the data across a plurality of the smaller form factor disk drives. The system of FIG. 2 operates in a manner similar to the IBM 3990 Storage Control System for data record read and write requests that are received from host processors 101, 121 by storage control unit 105 for execution by disk drives 109 to which storage control unit 105 is connected via conductors 108. The two storage paths within each cluster provide separate facilities that may be used concurrently to provide separate communication paths between the host processors 101, 121 and the disk drives 109. Each storage path within a cluster may independently process data record read and write requests. As in the IBM 3990 Storage Control System, volatile store (VS) 521 and non-volatile store (NVS) 520 are used on write requests requiring the services of cache memory 512. Read requests normally require the service of only volatile store 521.

Dynamic Virtual Device to Logical Device Mapping

With respect to data transfer operations, all data transfers go through cache memory 512. Therefore, front end or channel transfer operations are completely independent of backend or device transfer operations. In this system, staging operations are similar to staging in other cached disk subsystems but destaged transfers are collected into groups for bulk transfers. In addition, this data storage subsystem simultaneously performs free space collection, mapping table backup, and error recovery as background processes. Because of the complete front end/backend separation, the data storage subsystem 100 is liberated from the exacting processor timing dependencies of previous CKD disk subsystems. The subsystem is free to dedicate its processing resources to increasing performance through more intelligent scheduling and data transfer control.

The disk drive array data storage subsystem 1 consists of three abstract layers: virtual, logical and physical. The virtual layer functions as a conventional large form factor disk drive memory. The logical layer functions as an array of storage units that are grouped into a plurality of redundancy groups, each containing N+M disk drives to store N physical tracks of data and M physical tracks of redundancy information for each logical track. The physical layer functions as a plurality of individual small form factor disk drives. The data storage management system operates to effectuate the mapping of data among these abstract layers and to control the allocation and management of the actual space on the physical devices. These data storage management functions are performed in a manner that renders the operation of the disk drive array data storage subsystem 1 transparent to the host processors (101–121).

A redundancy group consists of N+M disk drives. The redundancy group is also called a logical volume or a logical device. Within each logical device there are a plurality of logical tracks, each of which is the set of all physical tracks in the redundancy group which have the same physical track address. These logical tracks are also organized into logical cylinders, each of which is the collection of all logical tracks within a redundancy group which can be accessed at a common logical actuator position. A disk drive array data storage subsystem appears to the host processor to be a collection of large form factor disk drives, each of which contains a predetermined number of tracks of a predetermined size called a virtual track. Therefore, when the host processor 101 transmits data over the data channel 104-1 to the data storage subsystem, the data is transmitted in the form of the individual records of a virtual track. In order to render the operation of the disk drive array data storage subsystem 1 transparent to the host processor 101, the received data is stored on the actual physical disk drives in the form of virtual track instances which reflect the capacity of a track on the large form factor disk drive that is emulated by data storage subsystem. Although a virtual track instance may spill over from one physical track to the next physical track, a virtual track instance is not permitted to spill over from one logical cylinder to another. This is done in order to simplify the management of the memory space. When a virtual track is modified by the host processor 101, the updated instance of the virtual track is not rewritten in data storage subsystem 1 at its original location but is instead written to a new logical cylinder and the previous instance of the virtual track is marked obsolete. Therefore, over time a logical cylinder becomes riddled with "holes" of obsolete data known as free space. In order to create whole free logical cylinders, virtual track instances that are still valid and located among fragmented free space within a logical cylinder are relocated within the disk drive array data storage subsystem 1 in order to create entirely free logical cylinders. In order to evenly distribute data transfer activity, the tracks of each virtual device are scattered as uniformly as possible among the logical devices in the disk drive array data storage subsystem 1. In addition, virtual track instances are padded out if necessary to fit into an integral number of physical device sectors. This is to insure that each virtual track instance starts on a sector boundary of the physical device.

Mapping Tables

Figure 7:
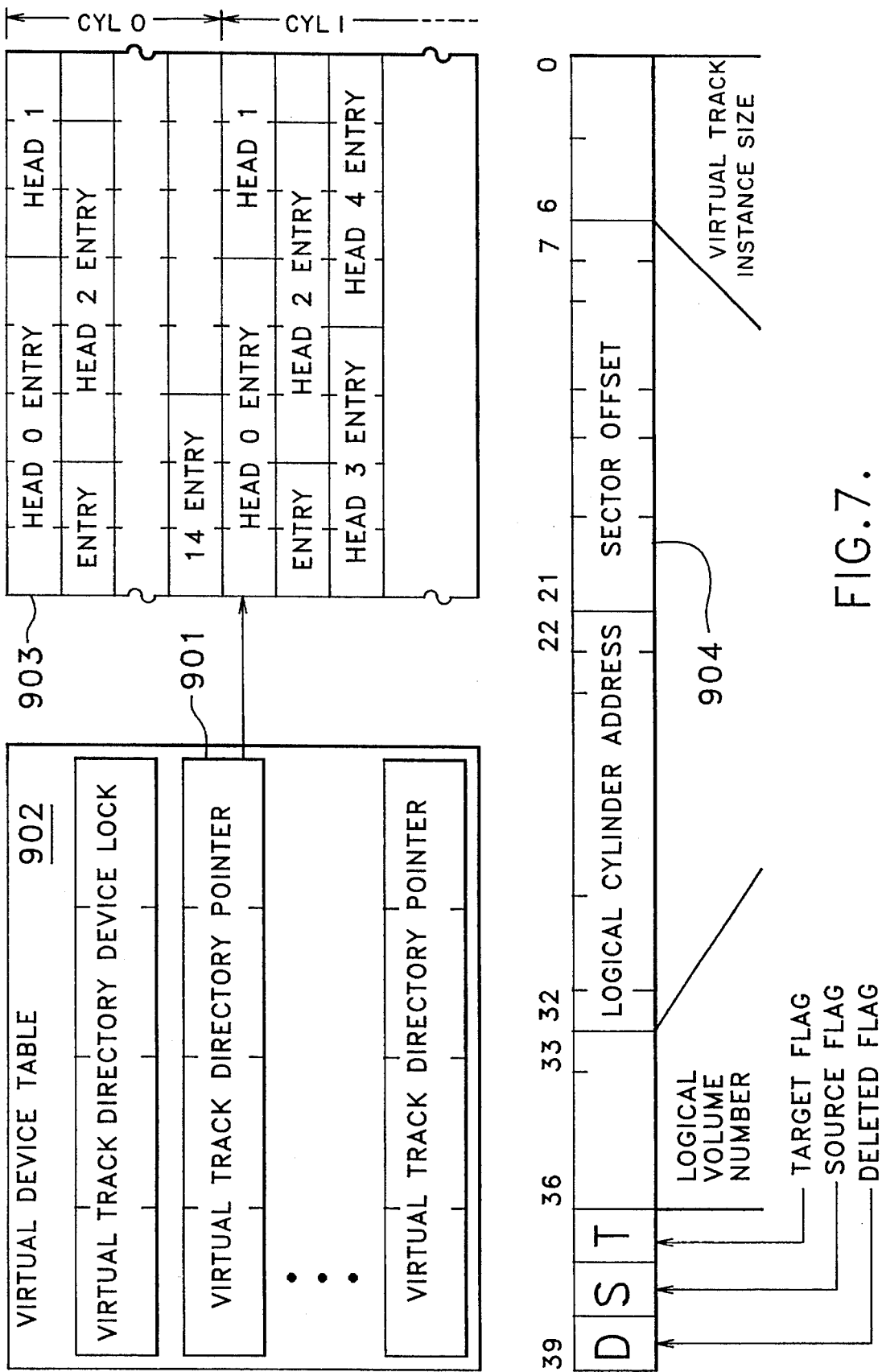
FIG. 7 illustrates in block diagram form the virtual track directory.

It is necessary to accurately record the location of all data within the disk drive array data storage subsystem 1 since the data received from the host processors 101, 121 is mapped from its address in the virtual space to a physical location in the subsystem in a dynamic fashion. A virtual track directory (FIG. 7) is maintained to recall the location of the current instance of each virtual track in the disk drive array data storage subsystem 1. The virtual track directory consists of an entry 904 for each virtual track which the associated host processor 101 can address. The virtual track directory is stored in noncontiguous pieces of the cache memory 512 and is addressed indirectly through pointers 901 in a virtual device table 902. The virtual track directory is updated whenever a new virtual track instance is written to the disk drives. Each entry 904 in the virtual track directory is for a single track and is addressed by the virtual track address. Each entry 904 in this table is typically 40 bits long and contains a number of fields. One of these fields is the deleted bit field which indicates whether this virtual track is presently valid or whether it is invalid because it has either not been written or was subsequently unwritten. A second field in the table entry is the source bit which indicates, when set, that this virtual track has been the source of a copy operation and the copy virtual device, cylinder and head fields in this virtual track directory entry point to a virtual address that contains the same data as that located in this virtual track. This virtual address pointed to by this virtual track directory entry is stored in the virtual track instance entry in this table that is pointed to by this particular virtual track directory entry. A third field in the table entry is the target bit which, when set, indicates that this virtual track is the destination of a copy operation and the copy virtual device, cylinder and head fields in the virtual track directory entry point to a virtual address that contains the same data as this virtual track. The fourth and fifth fields in this table entry are the logical volume number and logical cylinder address respectively. These entries contain data corresponding to the logical volume table and physical cylinder number, respectively. A sixth field in this table entry 904 is the sector offset field which contains data indicative of the offset to the start of the virtual track instance in the logical cylinder. This offset does not include parity track sectors. The seventh field in the table entry is the virtual track instance size which contains data indicative of the number of sectors that were used to store the virtual track.

Virtual Image of Fault Tolerant System

Figure 4:
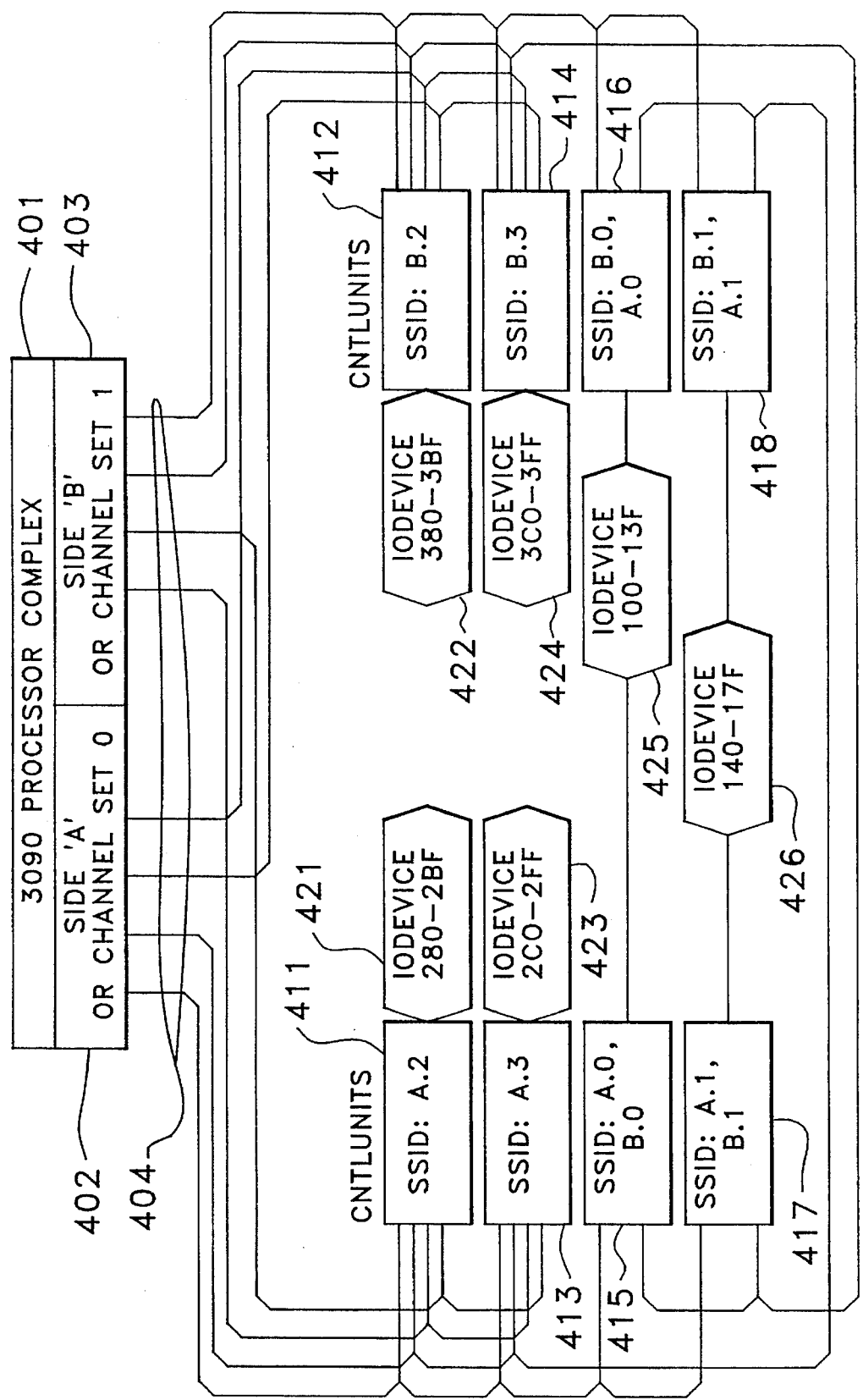
FIG. 4 illustrates the virtual image presented to the host processor.
Figure 5:
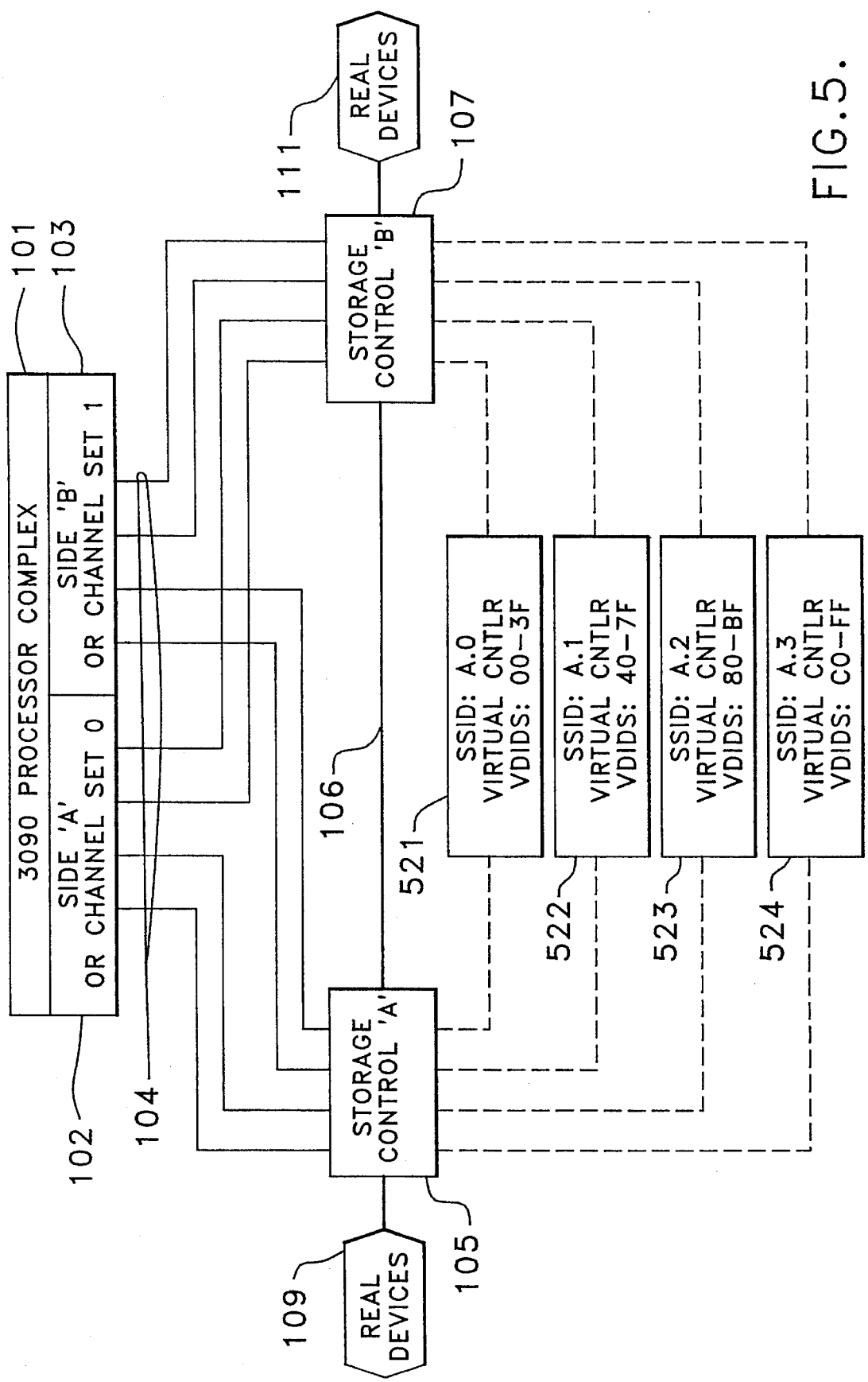
FIG. 5 illustrates the physical configuration of the data storage elements corresponding to the virtual image of FIG. 4.

FIGS. 4 and 5 illustrate schematically both the data storage image presented to the host processors 101, 121 and the physical configuration of the data substorage systems 1, 2. FIG. 4 illustrates in schematic diagram form the data storage architecture of a typical prior art data storage system. A host processor 401 is connected by two channel subsystems 402, 403 to a plurality of data channels 404 to transmit data to and from a plurality of data storage devices connected to the channels 404. As illustrated in FIG. 4, each of channels 404 is connected to four control units 411–418 in order to provide host processor 401 with access to a number of different data storage devices. Each of control units 411–418 is connected to at least one of associated data storage devices 421–426. These data storage devices 421–426 can either be connected to one of control units 411–418 or, as in the case of data storage devices 425, 426, shared between two control units 415, 416 and 417, 418, respectively. The shared device configuration permits host processor 401 to access the shared data storage device by way of two storage control units. This prevents the inaccessibility of the data stored on the shared data storage device in the event of the failure of a single one of the storage control units 411–418. A difficulty with this arrangement is that each of storage control units 415, 416 is attached to the associated shared data storage devices 425, 426 and maintains the same addressing range in order to enable the host processor 401 to access the data stored on the shared data storage devices 425,426 to either one of storage controls 415, 416 and 417,418. Therefore, each shared data storage device requires the use of redundant storage control capability in order to improve the reliability of data access for host processor 401.

In order to avoid the involvement of the processor in redundant data storage control capability, the data storage system of the present invention makes use of a data link 106 to interconnect two dynamically mapped disk drive array data storage subsystems 1, 2 in order to share the data therebetween. The disk drive array data storage subsystems 1, 2 operate independent of the host processors 101, 121 and dynamically map data records from the virtual device image presented to the host processor to actual physical storage locations in redundancy groups as described above. In FIG. 5, host processor 101 is connected by data channel subsystems 102, 103 to a plurality of data channels 104 to obtain access to the data storage devices 507, 508. Storage control units 105, 107 are interconnected to the plurality of data channels 104 in order to provide host processor 101 with access to the data storage devices 109, 111 connected to the associated storage controls 105, 107 respectively. A data link 106 is used to interconnect storage control units 105, 107 to exchange data and control signals therebetween as noted above. Since each storage control unit 105, 107 and associated data storage devices 109, 111 is comprised of a dynamically mapped disk drive array, the virtual device addresses used by host processor 101 to access data stored on the data storage devices 109, 111 is independent of the physical configuration of the disk drive array data storage subsystems 1, 2. Therefore, each of data storage subsystems 1, 2 can support more virtual devices by use of the dynamic mapping capability than the number of real devices represented by the storage capacity of the data storage subsystem. Since device addresses can be arbitrarily assigned in each of storage control units 105, 107, the configuration illustrated in FIG. 5 can support a plurality of virtual storage controls 521–524 whose virtual addresses are identical in both storage control units 105 and 107. The dotted line virtual storage controls 521–524 represent the image presented to host processor 101 by storage control units 105, 107 and their associated data storage devices 109, 111. Therefore, host processor 101 can access the data records in any of the virtual storage controls 521–524 through either of the storage control units 105, 107 as in the prior art system with the added advantage of not requiring dedication of control unit capability in order to provide this dual access path as in the prior art. The data records transmitted by host processor 101 to the storage control units 105, 107 are stored in the respective data storage devices 109, 111 connected thereto. The failure of one of the storage control units 105, 107 does not interrupt the access of host processor 101 to the data stored in the associated data storage devices 109, 111 since this data can be retrieved by way of the other storage control as described above.

Description of Channel Commands

The following describes the manner in which the system of the present invention, in particular storage control unit 105, responds to the reception of conventional channel program commands from a host processor 101 which are used to manage the fault tolerant configuration. DASD channel program commands are well-known in the DASD field. The channel, such as 123-0, receives a start I/O instruction from host processor 101 to start a channel program and then fetches a channel address word (CAW) for the program. The channel address word contains the address of the first channel command word (CCW) in the chain of channel command words comprising the channel program which is located in the host processor memory. After receiving the first channel command word, the channel selects a specific peripheral storage device such as a virtual disk drive 109, by sending the device address to storage control unit 105. If the selected virtual disk drive 109 is available, the command code for the first channel command word is sent to storage control unit 105 which returns an initial status byte to the channel indicating that the specified virtual disk drive 109 is available. If the selected virtual disk drive device 109 indicates busy in the initial status byte, a signal is sent to the host processor indicating this and the command is issued again by the host processor 101 a short time later.

A path such as path 134-1 interconnects channel 123 with interface circuit ICI element 201-1. This path comprises an I/O interface path. DASD write requests are conventionally established by the transmission over the channel of a DEFINE EXTENT command followed by a LOCATE RECORD command followed by a WRITE command. The DEFINE EXTENT command performs a number of functions the main one of which is to define limits on operations which follow in the same channel program. The LOCATE RECORD command causes the head to be positioned to a specified cylinder, track, and sector number. The LOCATE RECORD command also causes the data storage subsystem to search for a specified data record starting with the specified sector. The WRITE command causes the specified disk drive to write the data record transmitted immediately following the WRITE command to the disk drive. A read operation from a disk drive is controlled by the sequential transmission of a DEFINE EXTENT command, a LOCATE RECORD command and a READ command. The DEFINE EXTENT command and the LOCATE RECORD command are each associated with a block of data comprising a parameter list which specifies information required by the DASD system to effect the system operation associated with each command. The parameter list for each command is transmitted to the DASD subsystem immediately following the channel command.

The full sequence of channel commands and associated parameters and data transmitted on a typical DASD subsystem operation is:

```
DEFINE EXTENT command
    DEFINE EXTENT Parameter List
LOCATE RECORD command
    LOCATE RECORD Parameter List
WRITE DATA command
    DATA to be transmitted
READ COUNT KEY DATA
    DATA that is read
```

The foregoing describes how the host processor employs conventional DASD IBM 3990 channel program commands to cause data records to be written and read by storage control unit 105.

Data Storage Subsystem Synchronization

In order for a storage control unit 105 which has received a data record write request from a host processor 101 to be able to honor that write request for a duplicated data record, that storage control unit 105 must be in possession of a token called the virtual device lock for the virtual volume which contains the requested data record. The reason such a lock must exist is because only one of storage control units 105, 107 at any one time may have the responsibility for the integrity of the virtual volume during the write process. It is therefore necessary that storage control unit 105 know that storage control unit 107 is not at the same time also trying to write to the same virtual volume. Storage control unit 105 must obtain a virtual device lock that is passed back and forth between storage control units 105, 107 upon the request of either one of them when the two storage control units 105, 107 require access to the virtual volume. It is necessary that this lock be owned by a storage control unit in order for it to provide write access to the volume and also to provide read access. The reason that this is necessary is because one storage control unit did not own the lock, and the remote storage control could attempt to read a data record while another storage control unit was trying to write the data record. In order to avoid that data integrity exposure, the virtual device lock must be held by a storage control unit when that storage control unit is processing either a read or a write request from a host processor against the particular virtual volume.

Data Record Write Operations

Figure 6:
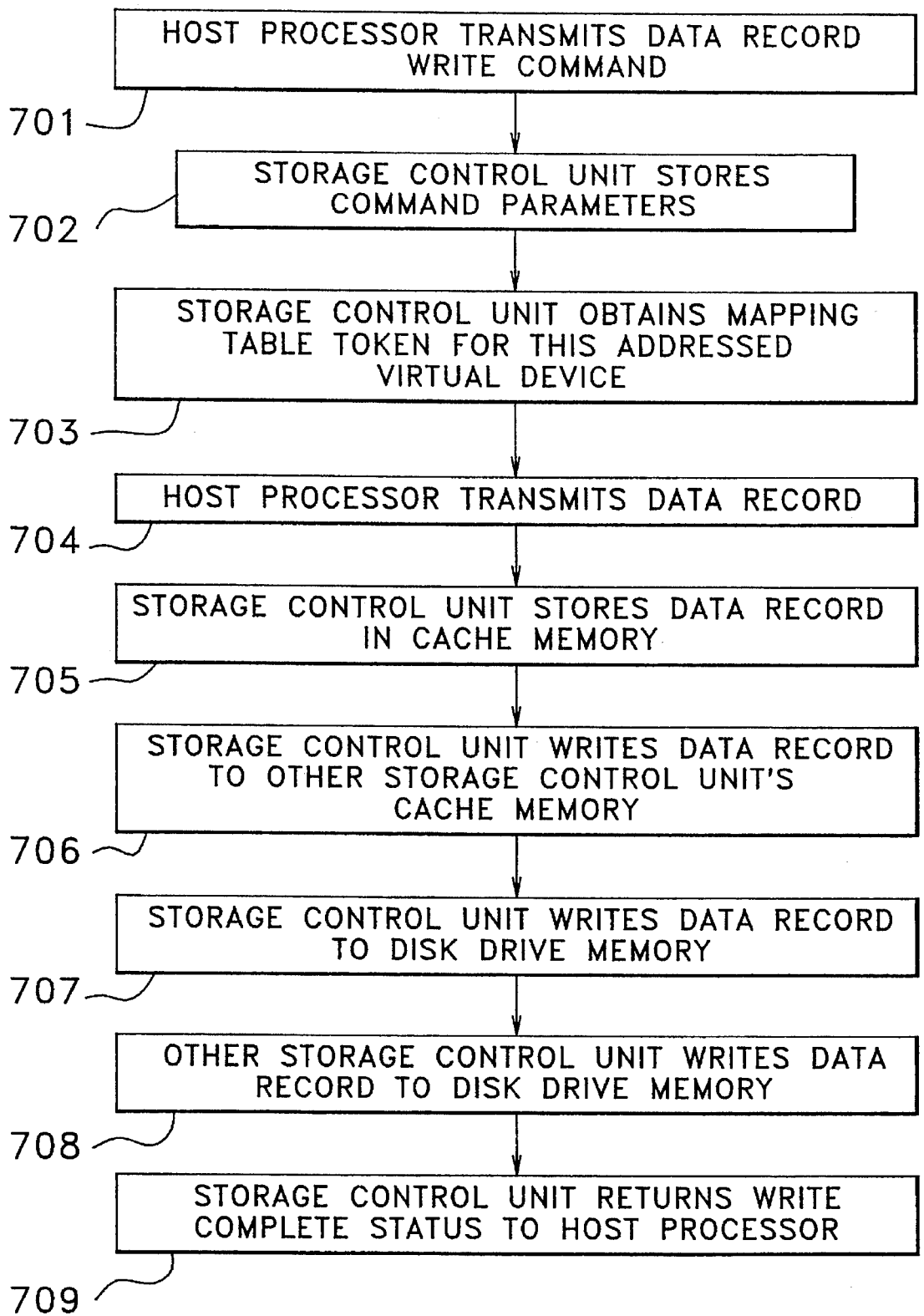
FIG. 6 illustrates in flow diagram form the operational steps taken by the system to write a data record.

FIG. 6 illustrates in flow diagram form the operational steps taken by the data storage system 1 to write data records received from a host processor 101, 121. At step 701, host processor, such as 101, transmits a data record write command to the data storage system 1 and, in particular, to storage control unit 105 via data channel 104-1. Let it be assumed that the selected volume is one that a user has priorly specified to the interconnected data storage subsystems 1, 2 as an enhanced reliability volume which status is noted in the virtual device table entry associated with this volume. The shared virtual device status is stored in the virtual device table on a virtual volume basis to differentiate shared virtual volumes from non-shared virtual volumes. This data maintained in the virtual device table creates the virtual images illustrated in FIG. 5 and this data can be input into the virtual device table via an operator panel on the data storage subsystem or via configuration software resident on the host processor. The data storage subsystem reads the status bit as part of the mapping process when the mapping table is accessed to identify the physical location of a data record.

This storage cluster 501 receives the host processor data record write command via ICI element 201-0, and microprocessor 204-0 at step 702 stores the command parameters associated with the data record write command received from host processor 101. At step 703, storage control unit 105 obtains the virtual device token for the virtual drive device that is addressed by the host processor data record write command. As noted above, the token is required in order to maintain data record consistency between the two data storage systems. Once the token is obtained by storage control unit 105, host processor 101 at step 704 transmits the data record via channel 103, path 104-1 to ICI circuit 201-0 contained within storage cluster 501. Upon receipt of the data record, storage cluster 501 forwards the data record via ICC circuit 202-0 to store the data record at step 705 in cache memory 512. Cache memory 512 writes the data record into volatile store 521 and non-volatile store 520. Once the data record has been received and stored in cache memory 512, processor 204 of storage cluster 501 updates the mapping table information contained in shared memory 512 to reflect the receipt of the data record from host processor 101. At step 706, storage cluster 501 forwards the data record(s) to storage control unit 107 by transmitting this data over data link 106 via IDI circuit 205-0 and storage control unit 107 stores the received data record in its cache memory. Storage control unit 107, upon receipt of the data record, updates its mapping table to show presence of data record in cache memory. At step 707, storage control unit 105 returns a write complete status message to host processor 101. At step 708, storage control unit 105 writes the data record from cache memory 512 through IDI element 205-0 and path 108-0 to disk controller 112 and thence into a selected redundancy group of the disk drives 109. At step 709, storage control unit 107 writes the data record from its cache memory into a selected redundancy group of the disk drives 111. This operation completes the storage of the data record in physical memory within the data storage systems 1 and 2 and the updating of the mapping tables to emulate a single physical device shared between two storage control units 105, 107.

Data write operations preserve data integrity and availability by maintaining two copies of all data modifications in each of storage control units 105, 107. One copy is in volatile store 521 while the other is in non-volatile store 520. If a copy of a data record is in cache memory 512 when the channel initiates a basic write caching write request (write hit), storage control unit 105 writes into cache memory 512. The data record in cache memory 512 is updated because it may be referred to again.

It is apparent from this arrangement, that host processor 101 can access the data record via the mapping tables and data records of either storage control unit 105 or 107. The physical copy of the requested data record is stored both on disks 109 and 111 and it is transparent to the host processor 101 whether the data is physically stored/retrieved by storage control unit 105 or 107. When host processor 101 transmits a data record read request to either of storage control units 105 or 107, The storage control unit that receives the request uses its mapping tables to determine the physical location of the requested data record or its attached disks. Thus, the data record can be retrieved by the host processor from the disk drives 109, 111 without requiring that the host processor be aware of the physical configuration of the data storage subsystems 1, 2 and with the added reliability of having two storage control units 105, 107 manage the physical storage and retrieval of data on these disk drives.

While a specific embodiment of this invention has been disclosed, it is expected that those skilled in the art can and will design alternate embodiments of this invention that fall within the scope of the appended claims.

We claim:

1. A disk memory system that stores data records for at least one data processor in a fault tolerant mode, comprising:

two data storage subsystems, each storing data records for said data processor, each of said data storage subsystems including:

a plurality of disk drives located in said data storage subsystem, a subset of said plurality of disk drives being configured into at least two redundancy groups, each said redundancy group consisting of at least two disk drives, storage control means, including means, responsive to the receipt of a stream of data records from said data processor and designated by said data processor for storage in available memory space in said data storage subsystem, for selecting available memory space in one of said redundancy groups to store said received stream of data records thereon, means, in said storage control means, for writing said received stream of data records and redundancy data associated with said received stream of data records in said selected available memory space in said one redundancy group, means for maintaining data indicative of the physical location of data records stored in said plurality of redundancy groups;

means, interconnecting said storage control means with a storage control means located in the other one of said two data storage subsystems, for exchanging control and data signals therebetween; and wherein said storage control means includes means, responsive to writing a data record to said one redundancy group, for transmitting said written data record to said storage control means connected to said exchanging means and located in said other data storage subsystem to maintain duplicate data records in both said data storage subsystems absent transmission of instructions to said data storage subsystem to create said duplicate data records by said data processor.

2. The system of claim 1 wherein each of said storage control means further comprises:

means, responsive to said data record being received from said exchanging means, for selecting available memory space in one of said redundancy groups to store said received stream of data records thereon; and means for writing said received stream of data records and redundancy data associated with said received stream of data records in said selected available memory space in said one redundancy group.

3. The system of claim 1 wherein each of said storage control means further comprises:

means, responsive to said data processor requesting said data storage subsystem to read a data record from a selected redundancy group, for reading said maintained data to identify the physical storage location of said requested data record in said plurality of disk drives that comprise said selected redundancy group.

4. The system of claim 3 wherein each of said storage control means further comprises:

means, responsive to a failure of said selected redundancy group, for presenting a device not operational status to said host processor.

5. The system of claim 1 wherein said transmitting means comprises:

means for maintaining data indicative of a shared virtual device status for each of said redundancy groups, independent of said data processor;

means, responsive to said data processor transmitting a data record to said data storage subsystem for storage on a selected redundancy group, for reading said maintained shared virtual device status data for said selected redundancy group; and means, responsive to said redundancy group being a shared virtual device, for transmitting said received data record to said other data storage subsystem absent transmission of instructions to create said duplicate data records by said data processor.

6. In a disk memory system that comprises two data storage subsystems, each storing data records for said data processor, each of said data storage subsystems including a plurality of disk drives, a subset of said plurality of disk drives being configured into at least two redundancy groups, each said redundancy group consisting of at least two disk drives, wherein said two data storage subsystems are interconnected by a data link for exchanging control and data signals therebetween, a method of storing data records for at least one data processor in a fault tolerant mode, comprising the steps in one of said data storage subsystems of:

selecting, in response to the receipt of a stream of data records from said data processor, available memory space in one of said redundancy groups to store said received stream of data records thereon;

writing said received stream of data records and redundancy data associated with said received stream of data records in said selected available memory space in said one redundancy group;

maintaining data indicative of the physical location of data records stored in said plurality of redundancy groups;

transmitting, in response to writing a data record to said one redundancy group, said written data record to the other of said data storage subsystems via said data link to maintain duplicate data records in both said data storage subsystems absent transmission of instructions to said data storage subsystem to create said duplicate data records by said data processor.

7. The method of claim 6 further comprising the steps of:

selecting, in response to said data record being received from said data link, available memory space in one of said redundancy groups to store said received stream of data records thereon; and writing said received stream of data records and redundancy data associated with said received stream of data records in said selected available memory space in said one redundancy group.

8. The method of claim 6 further comprising the steps of:

reading, in response to said data processor requesting said data storage subsystem to read a data record from a selected redundancy group, said maintained data to identify the physical storage location of said requested data record in said plurality of disk drives that comprise said selected redundancy group.

9. The method of claim 8 further comprising the step of:

presenting, in response to a failure of said selected redundancy group, a device not operational status to said host processor.

10. The method of claim 6 further comprising the steps of:

maintaining data indicative of a shared virtual device status for each of said redundancy groups independent of said data processor;

reading, in response to said data processor transmitting a data record to said data storage subsystem for storage on a selected redundancy group, said maintained shared virtual device status data for said selected redundancy group; and transmitting, in response to said redundancy group being a shared virtual device, said received data record to said other data storage subsystem absent transmission of instructions to create said duplicate data records by said data processor.

11. A disk memory system that stores data records for at least one data processor in a fault tolerant mode, comprising:

two data storage subsystems, each storing data records for said data processor, each of said data storage subsystems including:

a plurality of disk drives located in said data storage subsystem, a subset of said plurality of disk drives being configured into at least two redundancy groups, each said redundancy group consisting of at least two disk drives, means, responsive to the receipt of a stream of data records from said data processor and designated by said data processor for storage in available memory space in said data storage subsystem, for selecting available memory space in one of said redundancy groups to store said received stream of data records thereon, means for writing said received stream of data records and redundancy data associated with said received stream of data records in said selected available memory space in said one redundancy group;

means for maintaining data indicative of the physical location of data records stored in said plurality of redundancy groups;

means, interconnecting said two data storage subsystems, for exchanging control and data signals therebetween; and wherein each said data storage subsystem further includes:

means, connected to said exchanging means and responsive to writing a data record to one of said redundancy groups, for transmitting said written data record to the other of said two data storage subsystems connected to said exchanging means to maintain duplicate data records in both said data storage subsystems absent transmission of instructions to said data storage subsystem to create said duplicate data records by said data processor.

12. The system of claim 11 wherein each of said data storage subsystems further comprises:

means responsive to said data record being received from said exchanging means, for selecting available memory space in one of said redundancy groups to store said received stream of data records thereon; and means for writing said received stream of data records and redundancy data associated with said received stream of data records in said selected available memory space in said one redundancy group.

13. The system of claim 11 wherein each of said data storage subsystems further comprises:

means, responsive to said data processor requesting said data storage subsystem to read a data record from a selected redundancy group, for reading said maintained data to identify the physical storage location of said requested data record in said plurality of disk drives that comprise said selected redundancy group.

14. The system of claim 13 wherein each of said data storage subsystems further comprises:

means, responsive to a failure of said selected redundancy group, for presenting a device not operational status to said host processor.

15. The system of claim 11 wherein said transmitting means comprises:

means for maintaining data indicative of a shared device status for each of said redundancy groups independent of said data processor;

means, responsive to said data processor transmitting a data record to said data storage subsystem for storage on a selected redundancy group, for reading said maintained shared device status data for said selected redundancy group; and means, responsive to said redundancy group being a shared device, for transmitting said received data record to said other data storage subsystem independent of said data processor.

16. A data storage system adapted to be connected to a host computer, comprising:

a first data storage control;

a second data storage control;

a first recording means comprising a plurality of recording elements connected to said first data storage control and a second recording means comprising a plurality of different recording elements connected to said second data storage control;

each of said data storage controls being operable independent of each other to write a data record on a specified one of the plurality of recording elements to which only that said data storage control is connected;

a data link transmission path interconnecting said first and second data storage controls;

means in said first data storage control operable independent of said host computer for defining a first recording element of said first recording means as well as a first recording element of said second recording means as a copy pair of recording elements;

means unique to said first data storage control, operable independent of said second data storage control, and responsive to receipt from said host computer of a data record write request and accompanying data record for writing said data record on said first recording element of said first recording means;

means in said first data storage control for transmitting said data record write request and said accompanying data record over said data link transmission path to said second data storage control; and means unique to said second data storage control and responsive to the receipt of said data record write request and said accompanying data record over said data link transmission path for writing said data record by said first recording element of said second recording means.

17. The data storage system of claim 16 wherein said data link transmission path comprises a direct connection between said first and second data storage controls that is devoid of switching means.

18. The data storage system of claim 16 wherein each of said data storage controls contains a cache memory, said data storage system further comprises:

means in each data storage control responsive to the receipt of said data record by said each data storage control for entering said received data record into the cache memory of said each data storage control;

means for returning a command complete signal to said host computer from said first data storage control when said data record is entered into said cache memory of each data storage control; and wherein said means for writing comprises means for applying said data record in each cache memory to the recording means connected to the data storage control containing said each cache memory to control the writing of said data record by said first recording element of said recording means of each data storage control.

19. The data storage system of claim 16 further comprising:

a first path extending from said host computer to said first data storage control for the transmission of information including data record write requests and accompanying data records from said host computer to said first data storage control;

a second path extending from said host computer to said second data storage control for the transmission of information including data record write requests and accompanying data records from said host computer to said second data storage control;

said second data storage control being responsive to the receipt of said data record write requests and accompanying data records over said second path for writing said data records received over said second path on said first recording element of said second recording means.

20. The data storage system of claim 19 wherein said data link transmission path comprises a direct connection between said first and second data storage controls that is devoid of switching means.

21. The data storage system of claim 19 further comprising:

means in second data storage control, responsive to said receipt of said data record write requests and accompanying data records received over said second path, for transmitting said data record write requests and accompanying data records over said data link transmission path to said first data storage control; and means in said first data storage control, operable independent of said host computer and responsive to said receipt of said data record write requests and accompanying data records over said data link transmission path, for writing said data records received by said first data storage control over said data link transmission path on said first recording element of said first recording means.

22. The data storage system of claim 21 wherein said data link transmission path comprises a direct connection between said first and second data storage controls that is devoid of switching means.

23. The data storage system of claim 21 wherein each of said data storage controls contains a cache memory, said data storage system further comprises:

means in each data storage control, responsive to the receipt of a data record write request and accompanying data record over said data link transmission path connected to said data storage control, for entering said received data record into the cache memory of said data storage control that received said data record write request and data record over said data link transmission path;

means for returning a command complete indication to said host computer from the data storage control that received said data record write request and data record from said host computer when said data record is entered into said cache memory of each data storage control; and wherein said means for writing comprises means for applying said data record in each cache memory to the recording means connected to the data storage control containing said each cache memory to control the writing of said data record by said first recording element of said recording means.

24. A data storage system adapted to be connected to a host computer, comprising:

a first data storage control;

a second data storage control;

a first group of disk drives connected exclusively to said first data storage control;

a second group of disk drives connected exclusively to said second data storage control;

each of said data storage controls being operable independent of each other to write a data record by a specified one of the disk drives to which only that said data storage control is connected;

a data link transmission path interconnecting said data storage controls;

means in said first data storage control for receiving information from said host computer;

means in said first data storage control operable independent of said host computer for defining a specified one of said disk drives of said first group of disk drives and a specified one of said second group of disk drives as a copy pair of disk drives;

means in said first data storage control, responsive to receipt of a data record write request and an accompanying data record, for transmitting said received data record accompanying said data record write request over said data link transmission path to said second data storage control;

means unique to said first data storage control and further responsive to said receipt of said data record write request, for writing said accompanying data record on said one disk drive of said first group; and means unique to said second data storage control and responsive to the reception of said data record over said data link transmission path, for writing said data record on said one disk drive of said second group.

25. The data storage system of claim 24 wherein said data link transmission path comprises a direct connection between said data storage controls that is devoid of switching means.

26. The data storage system of claim 24 wherein each of said data storage controls contains a cache memory, said data storage system further comprises:

means in each data storage control, responsive to the receipt of a data record by said each data storage control, for entering said each received data record into the cache memory of said each data storage control;

means for returning a command complete signal to said host computer from said first data storage control when a data record received by each data storage control is entered into said cache memory of said each data storage control; and wherein said means writing comprises means for applying said data record in each cache memory to a disk drive connected to the data storage control containing said each cache memory to control the writing of said data record by said disk drive.

27. The data storage system of claim 24 further comprising:

a first path extending from said host computer to said first data storage control for the reception of information including data records from said host computer;

a second path extending from said host computer to said second data storage control for the transmission of information including data records to said second data storage control;

means in said second data storage control for receiving information over said second path from said host computer;

means in said second data storage control, responsive to the receipt of a data record write request and an accompanying data record, for writing said accompanying data record on said second group of disk drives;

means in said second data storage control, operable independent of said host computer, for defining a specified one of said disk drives of said first group of disk drives and a specified one of said second group of disk drives as a copy pair of disk drives;

means in said second data storage control, responsive to a subsequent receipt of a data record write request and accompanying data record directed to said specified one disk drive of said second group, for transmitting said received data record over said data link transmission path to said first data storage control;

means unique to said second data storage control and responsive to said subsequent receipt of said data record write request and accompanying data record for writing said received data record on said specified one disk drive of said second group; and means unique to said first data storage control and responsive to the receipt of said data record over said data link transmission path for writing said data record on said specified one disk drive of said first group of disk drives.

28. The data storage system of claim 27 wherein each of said data storage controls contains a cache memory, further comprising:

means in each data storage control, responsive to the receipt of a data record by said each data storage control, for entering said received data record into the cache memory of said each data storage control;

means for returning a command complete signal to said host computer from said data storage control that receives a data record from said host computer when said data record is entered into said cache memory of each data storage control; and wherein said means for writing comprises means for applying a data record in each cache memory to a disk drive connected to the data storage control containing said each cache memory to control the writing of said data record by said disk drive.

29. A data storage system adapted to be connected over channel interface paths to a first and a second host computer for the writing of multiple copies of data records received by said data storage system over any of said channel interface paths from either of said host computers, said data storage system comprising:

a first and a second data storage control connected via separate ones of said channel interface paths to each of said host computers;

a first group of disk drives connected to said first data storage control and a second group of disk drives connected to said second data storage control;

a direct data link transmission path devoid of switching means interconnecting said data storage controls;

means in each of said data storage controls for receiving a data record from either of said host computers over said channel interface paths;

means unique to each data storage control independent of the other data storage control,] and responsive to the reception of a data record over one of said channel interface paths for writing said data record on a disk drive of the group to which said each data storage control receiving said data record is connected;

means in said each data storage control, responsive to the receipt of said data record over one of said channel interface paths for transmitting said data record over said data link transmission path to the other one of said data storage controls; and means unique to said other data storage control and responsive to the reception of said data record over said data link transmission path for writing said data record on a disk drive of the group to which said other data storage control is connected.

30. The data storage system of claim 29 wherein each of said data storage controls contains a cache memory, further comprising:

means in each data storage control responsive to the receipt of said data record over a channel interface path for entering said received data record into the cache memory of each of said data storage controls;

means for returning a command complete signal to said host computer from the data storage control that receives a data record over a channel interface path when said received data record is entered into said cache memory of each of said data storage controls; and wherein said means for writing comprises means for applying said data record in each cache memory to a disk drive connected to the data storage control containing said each cache memory to control the writing of said data record by said disk drive of each data storage control.

31. A data storage system adapted to be connected over channel interface paths to a first and a second host computer, apparatus for the writing of multiple copies of data records received by said data storage system over any of said channel interface paths from either of said host computers comprising:

a first and a second data storage control being operable for receiving a data record from either of said host computers over one of said channel interface paths;

said first data storage control being operable independent of said second data storage control in response to the receipt of a data record over one of said channel interface paths for writing said data record on a disk drive of a group of drives to which only said first data storage control is connected;

means in said first data storage control operable in response to the receipt of said data record over one of said channel interface paths for transmitting said data record over a data link transmission path to said second data storage control;

means in said second data storage control operable in response to the receipt of said data record over one of said channel interface paths for transmitting said data record over a data link transmission path to said first data storage control; and means in said second data storage control operable in response to the receipt of said data record over said data link transmission path for writing said data record on a disk drive of a group to which only said second data storage control is connected.

32. The apparatus of claim 31 further comprising:

means in each data storage control operable in response to the receipt of said data record over a channel interface path for entering said received data record into a cache memory of each of said each data storage control;

means for returning a command complete signal to said host computer from the data storage control that receives a data record over a channel interface path when said received data record is entered into said cache memory of each of said data storage controls; and means for applying said data record in each cache memory to a disk drive of a group connected to the data storage control containing said each cache memory to control the writing of said data record by said disk drive of a group connected to said each data storage control.

33. A data storage system containing a plurality of data storage controls and adapted to be connected over channel interface paths to a first and a second host computer for the writing of multiple copies of data records received by said data storage system over any of said channel interface paths from either of said host computers comprising:

each data storage control being operable independent of all other data storage controls in response to the receipt of a data record over one of said channel interfaces paths from either of said host computers for writing said data record on a disk drive of a group of drives to which only said each data storage control receiving said data record is connected;

said each data storage control being operable in response to the receipt of said data record over one of said channel interface paths for transmitting said data record over a data link transmission path to another one of said data storage controls; and means in said other data storage control being operable in response to the receipt of said data record over said data link transmission path for writing said data record on a disk drive of a group of drives to which only said other one data storage control is connected.

34. A data storage system adapted to be connected over first and second channel interface paths, respectively, to a first and a second host computer, respectively, for writing a copy of data records received by said data storage system over any of said channel interface paths from either of said host computers comprising:

a first data storage control for receiving a data record write request and an accompanying data record over said first channel interface path from said first host computer;

a second data storage control for receiving a data record write request and an accompanying data record over said second path channel interface from said second host computer;

means in said second data storage control operable in response to the receipt of each data record write request from said second host computer and directed to a specified disk drive connected to said second data storage control for writing said data record accompanying each data record write request on said specified disk drive to which said second data storage control is connected;

means in said first data storage control operable independent of said first host computer for defining a specified one of said disk drives of said first group of disk drives and a specified one of said second group of disk drives as a copy pair of disk drives;

means in said first data storage control operable in response to receipt of a data record write request and an accompanying data record not directed to said specified drive of said first data storage control for writing the data record accompanying said request on a disk drive of a group to which said first data storage control is connected;

means in said first data storage control operable in response to a subsequent receipt of a data record write request and an accompanying data record directed to said specified disk drive for transmitting said data record over a data link transmission path to said second data storage control; and means in said second data storage control operable in response to the receipt of said data record over said data link transmission path for writing said data record on a disk drive to which said second data storage control is connected.

35. In a data storage system, adapted to be connected over channel interface paths to a first and a second host computer, apparatus for writing multiple copies of data records received by said data storage system over any of said channel interface paths from either of said host computers, comprising:

a first and a second data storage control for receiving a data record from either of said host computers over one of said channel interface paths;

each said data storage control being operable independent of the other data storage control in response to the receipt of a data record over one of said channel interface paths for writing said data record on a disk drive of a group of disk drives to which only said each data storage control receiving said data record is connected;

means unique to each said data storage control, operable in response to the receipt of said data record over one of said channel interface paths, for transmitting said data record over a data link transmission path to the other one of said data storage controls; and means unique to said other data storage control, responsive to the receipt of said data record over said data link transmission path, for writing said data record on a disk drive of a group to which only said other one data storage control is connected.

36. The apparatus of claim 35 further comprising:

means in each data storage control, responsive to the receipt of said data record over one of said channel interface paths for entering said received data record into a cache memory of each of said each data storage control;

means for returning a command complete signal to said host computer from the data storage control that receives a data record over a channel interface path when said received data record is entered into said cache memory of each of said data storage controls; and wherein said means for writing comprises means for applying said data record in each cache memory to a disk drive of a group connected to the data storage control containing said each cache memory to control the writing of said data record by said disk drive of a group connected to said each data storage control.

37. In a data storage system adapted to be connected over first and second channel interface paths, respectively, to a first and a second host computer, respectively, apparatus for the writing of a copy of data records received by said data storage system over any of said channel interface paths from either of said host computers, comprising:

means in a first data storage control for receiving a data record write request and an accompanying data record over said first channel interface path from said first host computer;

means in a second data storage control for receiving a data record write request and an accompanying data record over said second channel interface path from said second host computer;

means in said second data storage control, responsive to the receipt of each data record write request from said second host computer and directed to a specified disk drive connected to said second data storage control for writing said data record accompanying each data record write request on said specified disk drive to which said second data storage control is connected;

means in said first data storage control operable independent of said host computer for defining the provision of shared service upon a subsequent receipt of a data record write request and an accompanying data record directed to a specified phantom drive of a group of disk drives connected to said first data storage control;

means in said first data storage control, responsive to a subsequent receipt of a data record write request and an accompanying data record not directed to said phantom drive of said first data storage control for writing the data record accompanying each data record write request on a disk drive of a group to which said first data storage control is connected;

means in said first data storage control, responsive to a subsequent receipt of a data record write request and an accompanying data record directed to said specified phantom disk drive for transmitting said data record over a data link transmission path to said second data storage control; and means in said second data storage control, responsive to the receipt of said data record over said data link transmission path, for writing said data record on a disk drive to which said second data storage control is connected.

38. A method of operating a data storage system adapted to be connected to a host computer, said data storage system comprising a first data storage control, a second data storage control, a data link transmission path interconnecting said first and second data storage controls, a first plurality of recording elements connected to said first data storage control and a second plurality of different recording elements connected to said second data storage control, said method comprising the steps of:

operating each of said data storage controls to write a data record on a specified one of the plurality of recording elements to which each said data storage control is connected;

defining, independent of said host computer, in said first data storage control a first recording element of said first plurality of recording elements as well as a first recording element of said second plurality of recording elements as a copy pair of recording elements;

operating said first data storage control in response to the reception from said host computer of a data record write request and accompanying data record to write said data record on said first recording element of said first plurality of recording elements;

transmitting said data record write request and said accompanying data record from said first data storage control over said data link transmission path to said second data storage control; and operating said second data storage control in response to the receipt of said data record write request and said accompanying data record over said data link transmission path to write said data record on said first recording element of said second plurality of recording elements.

39. The method of claim 38 wherein said data link transmission path comprises a direct connection between said first and second data storage controls that is devoid of switching.

40. The method of claim 38 wherein each of said data storage controls contains a cache memory, said method further comprises the steps of:

operating each data storage control in response to the receipt of said data record by said each data storage control to enter said received data record into the cache memory of said each data storage control;

returning a command complete signal to said host computer from said first data storage control when said data record is entered into said cache memory of each data storage control; and applying said data record in each cache memory to the recording elements connected to the data storage control containing said each cache memory to control the writing of said data record by said first recording element of said plurality of recording elements of each data storage control.

41. The method of claim 38 wherein said data storage system comprises a first path extending from said host computer to said first data storage control for the reception of information including data record write requests and accompanying data records from said host computer, a second path extending from said host computer to said second data storage control for the transmission of information including data record write requests and accompanying data records from said host computer to said second data storage control, said method further comprising the step of:

operating said second data storage control in response to the receipt of said data record write requests and accompanying data records over said second path to write said data records received over said second path on said first recording element of said second plurality of recording elements.

42. The method of claim 41 wherein said data link transmission path comprises a direct connection between said first and second data storage controls that is devoid of switching.

43. The method of claim 41 further comprising the steps of:

transmitting from second data storage control, in response to said receipt of said data record write requests and accompanying data records received over said second path, said data record write requests and accompanying data records over said data link transmission path to said first data storage control; and operating said first data storage control in response to said receipt of said data record write requests and accompanying data records over said data link transmission path to write said data records received by said first data storage control over said data link transmission path on said first recording element of said first recording element.

44. The method of claim 43 wherein said data link transmission path comprises a direct connection between said first and second data storage controls that is devoid of switching.

45. The method of claim 44 wherein each of said data storage controls contains a cache memory, said method further comprises the steps of:

operating each data storage control in response to the receipt of a data record write request and accompanying data record over said path connected to said data storage control to enter said received data record into the cache memory of said data storage control that received said data record write request and data record over said path;

returning a command complete to said host computer from the data storage control that received said data record write request and data record from said host computer when said data record is entered into said cache memory of each data storage control; and applying said data record in each cache memory to the recording elements connected to the data storage control containing said each cache memory to control the writing of said data record by said first recording element of said recording elements.

46. A method of operating a data storage system adapted to be connected to a host computer, said data storage system comprising a first data storage control, a second data storage control, a data link transmission path interconnecting said data storage controls, a first group of disk drives connected to said first data storage control and a second group of disk drives connected to said second data storage control, said method comprising the steps of:

operating each of said data storage controls to write a data record on a specified one of the disk drives to which said each data storage control is connected;

receiving in said first data storage control information from said host computer;

operating said first data storage control in response to receipt of a data record write request and an accompanying data record to write said received data record on said first group of disk drives;

defining, independent of said host computer, a specified one of said disk drives of said first group of disk drives and a specified one of said second group of disk drives as a copy pair of disk drives;

transmitting, from said first data storage control, in response to receipt of said data record write request and an accompanying data record, said received data record accompanying said data record write request over said data link transmission path to said second data storage control;

operating said first data storage control in response to said receipt of said data record write request, to write said accompanying data record on said one disk drive of said first group; and operating said second data storage control in response to the reception of said data record over said data link transmission path, to write said record data on said one disk drive of said second group.

47. The method of claim 46 wherein said data link transmission path comprises a direct connection between said data storage controls that is devoid of switching.

48. The method of claim 46 wherein each of said data storage controls contains a cache memory, further comprising the steps of:

operating each data storage control in response to the receipt of a data record by said each data storage control to enter said each received data record into the cache memory of said each data storage control;

returning a command complete signal to said host computer from said first data storage control when a data record received by each data storage control is entered into said cache memory of said each data storage control; and applying said data record in each cache memory to a disk drive connected to the data storage control containing said each cache memory to control the writing of said data record by said disk drive.

49. The method of claim 46 wherein said data storage system further comprises a first path extending from said host computer to said first data storage control for the reception of information including data records from said host computer, a second path extending from said host computer to said second data storage control for the transmission of information including data records to said second data storage control, said method further comprising the steps of:

receiving in said second data storage control a data record write request over said second path from said host computer;

operating said second data storage control in response to the receipt of each received data record write request and an accompanying data record to write said accompanying data record on said second group of disk drives;

operating said second data storage control to transmit said received data record over said data link transmission path to said first data storage control, operating said second data storage control in response to a receipt of said data record write request and accompanying data record to write said received data record on said specified one disk drive of said second group, and operating said first data storage control in response to the receipt of said data record over said data link transmission path to write said data record on a disk drive of said first group of disk drives.

50. The method of claim 46 wherein each of said data storage controls contains a cache memory, further comprising the steps of:

operating each data storage control in response to the receipt of a data record by said each data storage control to enter said received data record into the cache memory of said each data storage control;

returning a command complete signal to said host computer from said data storage control that receives a data record from said host computer when said data record is entered into said cache memory of each data storage control; and applying a data record in each cache memory to a disk drive connected to the data storage control containing said each cache memory to control the writing of said data record by said disk drive.

51. A method of operating a data storage system adapted to be connected over channel interface paths to a first and a second host computer for the writing of multiple copies of data records received by said data storage system over any of said channel interface paths from either of said host computers, said data storage system comprising a first and a second data storage control connected via separate ones of said channel interface paths to each of said host computers, a first group of disk drives connected to said first data storage control and a second group of disk drives connected to said second data storage control, a direct data link transmission path devoid of switching apparatus interconnecting said data storage controls, said method comprising the steps of:

receiving in each of said data storage controls a data record from either of said host computers over said channel interface;

operating each data storage control independent of the other data storage control and in response to the reception of a data record over one of said direct data link transmission paths to write said data record on a disk drive of the group to which said each data storage control receiving said data record is connected;

operating said each data storage control in response to the receipt of said data record over one of said channel interface paths to transmit said data record over said data link transmission path to the other one of said data storage controls independent of said host computer;

operating said other data storage control independent of the other data storage control and in response to the reception of said data record over said data link transmission path to write said data record on a disk drive of the group to which said other data storage control is connected.

52. The method of claim 51 wherein each of said data storage controls contains a cache memory, said method further comprises the steps of:

operating each data storage control in response to the receipt of said data record over a channel interface path to enter said received data record into the cache memory of each of said data storage controls;

returning a command complete signal to said host computer from the data storage control that receives a data record over a channel interface path when said received data record is entered into said cache memory of each of said data storage controls; and applying said data record in each cache memory to a disk drive connected to the data storage control containing said each cache memory to control the writing of said data record by said disk drive of each data storage control.

53. A method of operating a data storage system adapted to be connected over channel interface paths to a first and a second host computer for the writing of multiple copies of data records received by said data storage system over any of said channel interface paths from either of said host computers, said method comprising the steps of:

operating a first and a second data storage control for receiving a data record from either of said host computers over one of said channel interface paths;

operating each data storage control in response to the receipt of a data record over one of said channel interface paths for writing said data record on a disk drive of a group of drives to which only said each data storage control receiving said data record is connected;

operating said each data storage control in response to the receipt of said data record over one of said channel interface paths for transmitting said record over a data link transmission path to the other one of said data storage controls; and operating said other data storage control in response to the receipt of said data record over said data link transmission path for writing said data record on a disk drive of a group to which only said other one data storage control is connected.

54. The method of claim 53 wherein said method further comprises the steps of:

operating each data storage control in response to the receipt of said data record over a channel interface path for entering said received data record into a cache memory of each of said each data storage control;

returning a command complete signal to said host computer from the data storage control that receives a data record over a channel interface path when said received data record is entered into said cache memory of each of said data storage controls; and wherein said step of writing comprises the step of applying said data record in each cache memory to a disk drive of a group connected to the data storage control containing said each cache memory to control the writing of said data record by said disk drive of a group connected to said each data storage control.

* * * * *